(12) United States Patent
Tsai

(10) Patent No.: US 7,375,952 B2
(45) Date of Patent: May 20, 2008

(54) ELECTRONIC DEVICE WITH A SLIDING ELEMENT

(75) Inventor: Kun-Shiang Tsai, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 0 days.

(21) Appl. No.: 11/709,206

(22) Filed: Feb. 22, 2007

(65) Prior Publication Data

US 2007/0217126 A1    Sep. 20, 2007

(30) Foreign Application Priority Data

Mar. 1, 2006    (TW) ............... 95106874 A

(51) Int. Cl.
*G06F 1/16* (2006.01)
(52) U.S. Cl. .................. 361/679; 361/683; 312/223.1
(58) Field of Classification Search ........ 361/679–683; 312/223.1, 223.2
See application file for complete search history.

(56) References Cited

U.S. PATENT DOCUMENTS

| 5,253,142 | A | * | 10/1993 | Weng ................. 361/681 |
| 5,255,154 | A | * | 10/1993 | Hosoi et al. ......... 361/681 |
| 5,701,232 | A | * | 12/1997 | Tang et al. .......... 361/683 |
| 6,310,766 | B1 | * | 10/2001 | Bae ................... 361/681 |
| 6,707,665 | B2 | * | 3/2004 | Hsu et al. ........... 361/681 |
| 6,785,141 | B2 | * | 8/2004 | Fang ................. 361/727 |
| 6,937,465 | B2 | * | 8/2005 | Park ................. 361/683 |
| 2005/0073808 | A1 | * | 4/2005 | Wang ................. 361/683 |

* cited by examiner

*Primary Examiner*—Jayprakash Gandhi
*Assistant Examiner*—Anthony Q Edwards
(74) *Attorney, Agent, or Firm*—Birch, Stewart, Kolasch & Birch, LLP

(57) ABSTRACT

A track formed on a housing of an electronic device provides a space for a sliding element to slide. The housing includes a first stopper and a second stopper formed on a first side of the track for preventing the sliding element from deviating from the track.

3 Claims, 8 Drawing Sheets

ELECTRONIC DEVICE WITH A SLIDING ELEMENT

BACKGROUND OF THE INVENTION

1. Field of the Invention

The present invention relates to an electronic device, and more particularly, to an electronic device with a sliding element.

2. Description of the Prior Art

When assembling a sliding element on a housing of an electronic device, an operator places the sliding element in a corresponding position on the housing and utilizes an adhesive tape to fix the sliding element so as to prevent the sliding element from coming loose. Then, other components are assembled sequentially, such as placing a circuit board inside the electronic device. After assembly is complete, the operator has to remove the tape. If some adhesive residue is left on a surface of the sliding element, the operator has to use chemicals to remove it.

It is very inconvenient to assemble the sliding element on the electronic device, and takes a significant amount of time. Therefore, it becomes important to simplify assembly so as to reduce time and cost.

SUMMARY OF THE INVENTION

The claimed invention provides an electronic device with a sliding element. The electronic device comprises a sliding element and a housing. The sliding element comprises a base, and a protrusion extended from the base. A track is formed on the housing for providing a space for the sliding element to slide. The housing comprises a first stopper extended from a first side of the track for assisting in assembly of the sliding element and the housing and for preventing the sliding element from deviating from the track, and a second stopper extended from the first side of the track for preventing the sliding element from deviating from the track.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
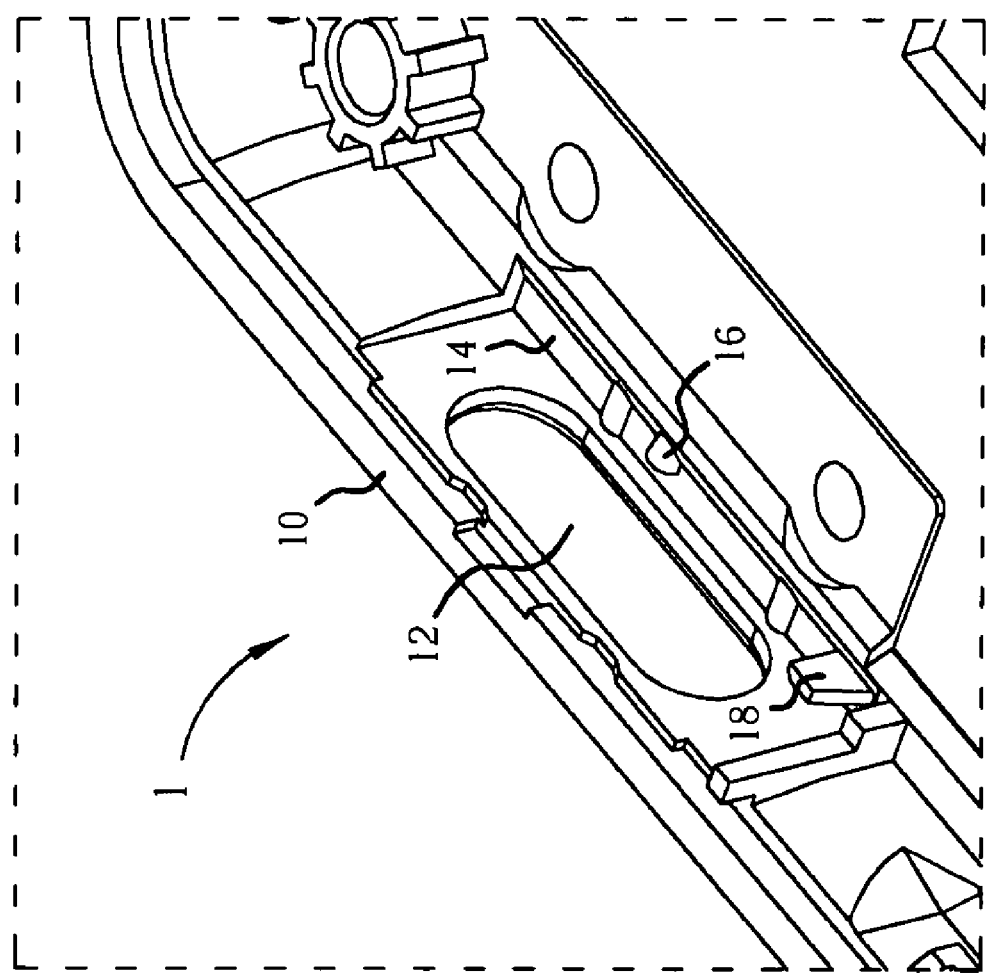
FIG. 1 is an embodiment of a housing of an electronic device based on the present invention.

Please refer to FIG. 1, which is an embodiment of a housing 10 of an electronic device 1 based on the present invention. A hole 12 and a track 14 are formed on the housing 10. The housing 10 comprises a first stopper 16 and a second stopper 18, both extended from a first side of the track 14. A height of the second stopper 18 is higher than a height of the first stopper 16. The hole 12 is formed on a second side of the track 14.

Figure 2:
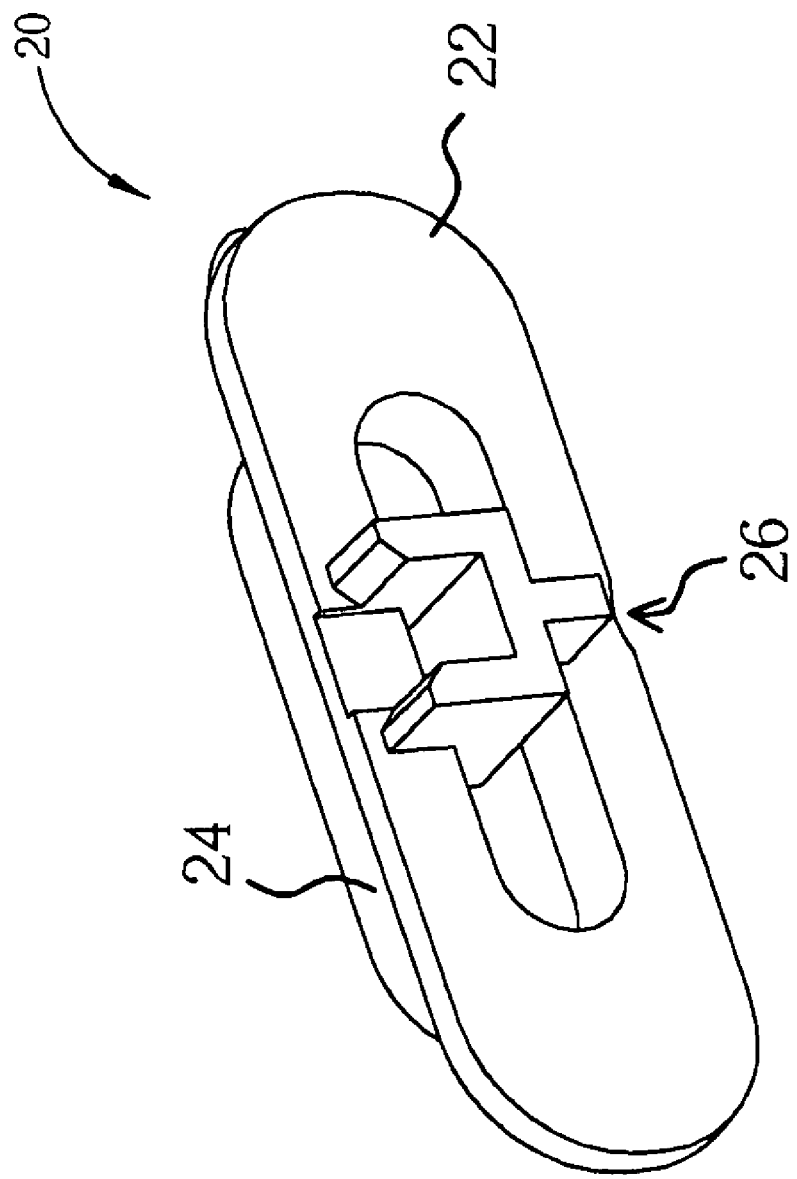
FIG. 2 is an embodiment of a sliding element of the present invention.
Figure 3:
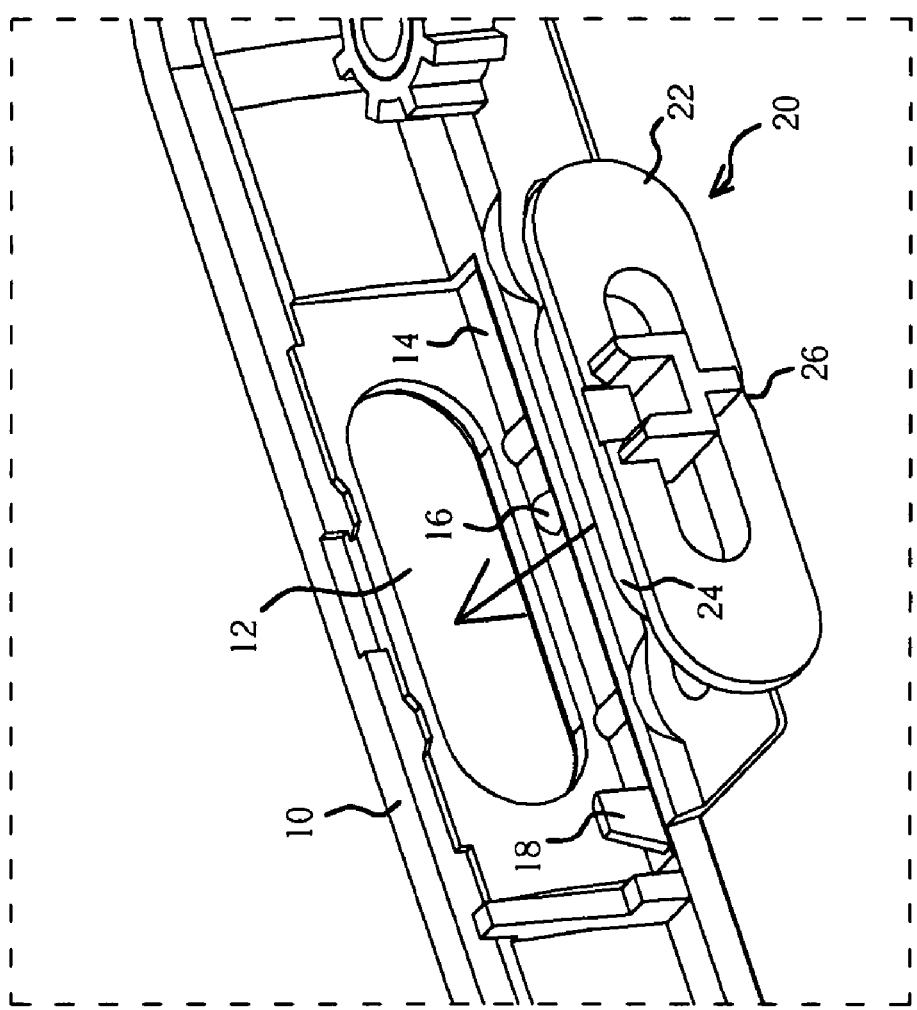
FIG. 3 to FIG. 7 are steps of assembling the sliding element of FIG. 2 and the housing of FIG. 1.

Please refer to FIG. 2, which is an embodiment of a sliding element 20 of the present invention. The sliding element 20 comprises a base 22 and a protrusion 24 extended from the base 22. A notch 26 is formed on a side of the base 22.

Figure 4:
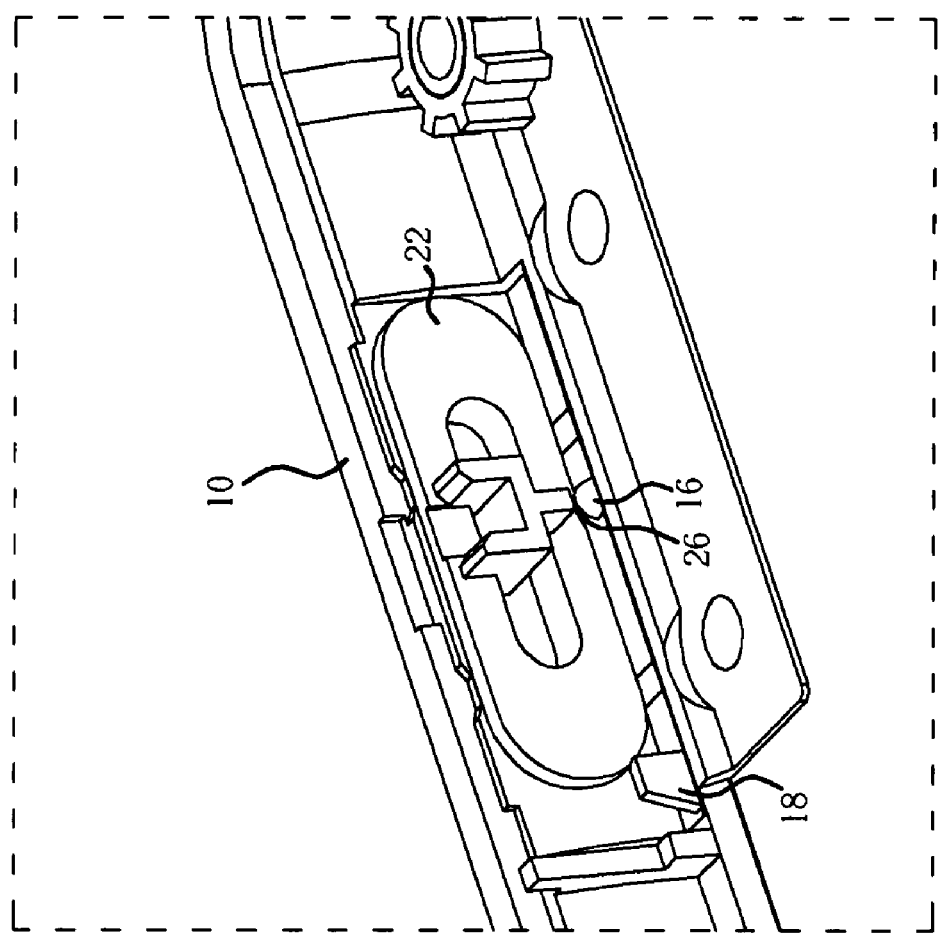
Figure 5:
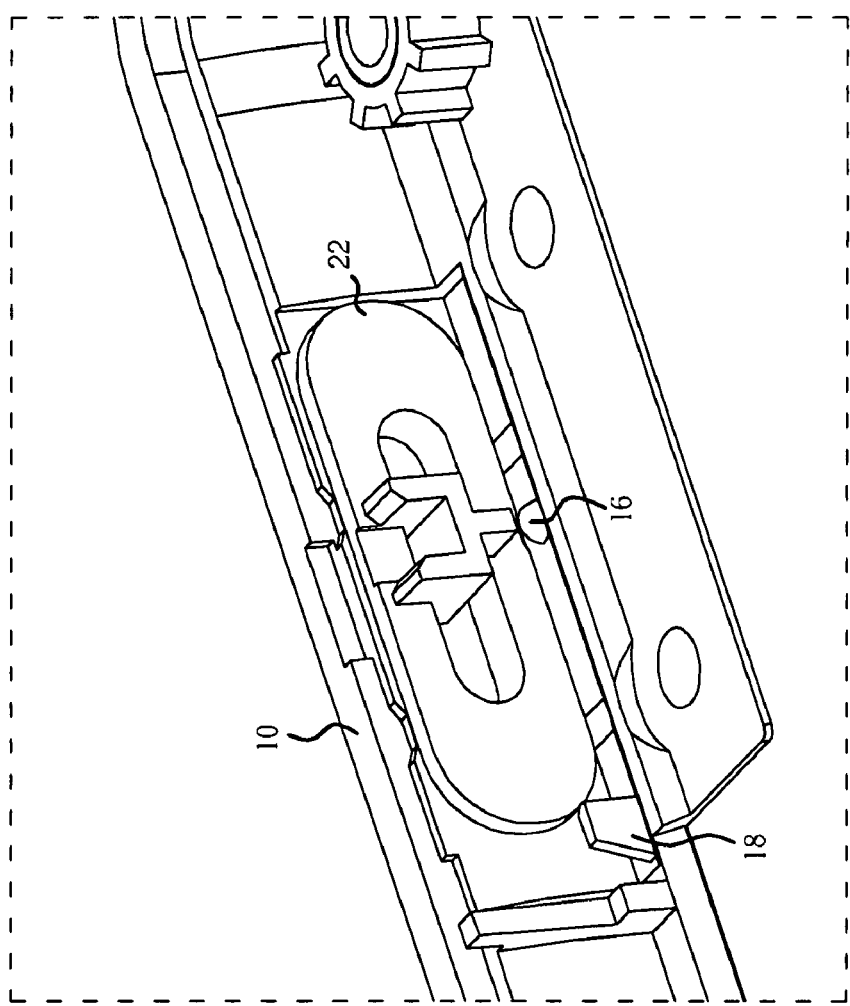

Please refer to FIG. 3 to FIG. 7, which are steps for assembly of the sliding element 20 of FIG. 2 and the housing 10 of FIG. 1. As indicated by the direction of the arrow shown in FIG. 3, the protrusion 24 of the sliding element 20 is pushed toward the hole 12 and the notch 26 faces downward. The interference between the notch 26 of the sliding element 20 and the first stopper 16 of the housing 10 can assist in assembly of the sliding element 20 and the housing 10, as shown in FIG. 4. After the sliding element 20 is completely pushed toward the hole 12, the base 22 of the sliding element 20 is on the track 14 of the housing 10, as shown in FIG. 5. Next, in FIG. 6, the sliding element 20 is pushed in the direction of the arrow, so that the first stopper 16 and the second stopper 18 can prevent the sliding element 20 from deviating from the track 14. Then, other components continue to be assembled.

Figure 6:
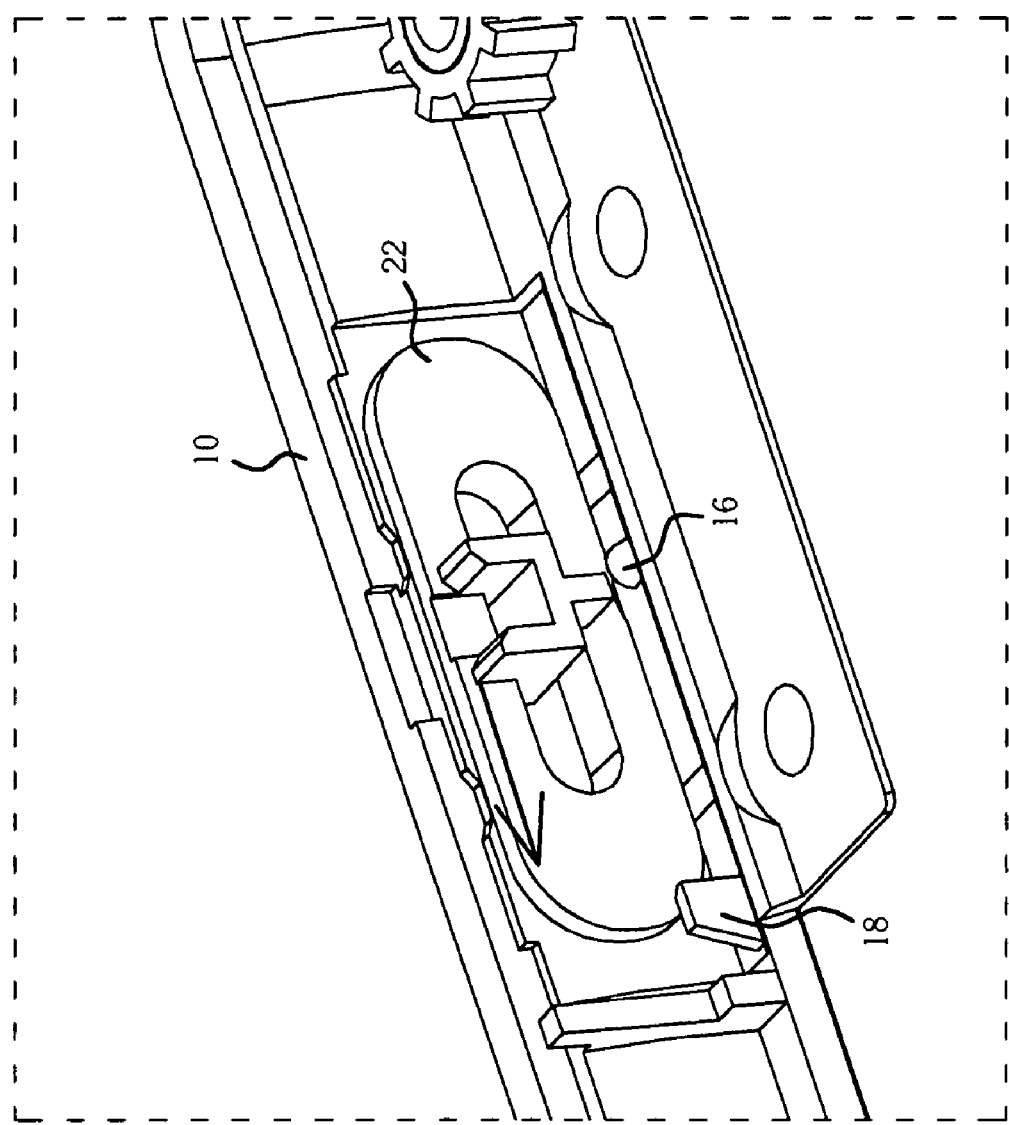
Figure 7:
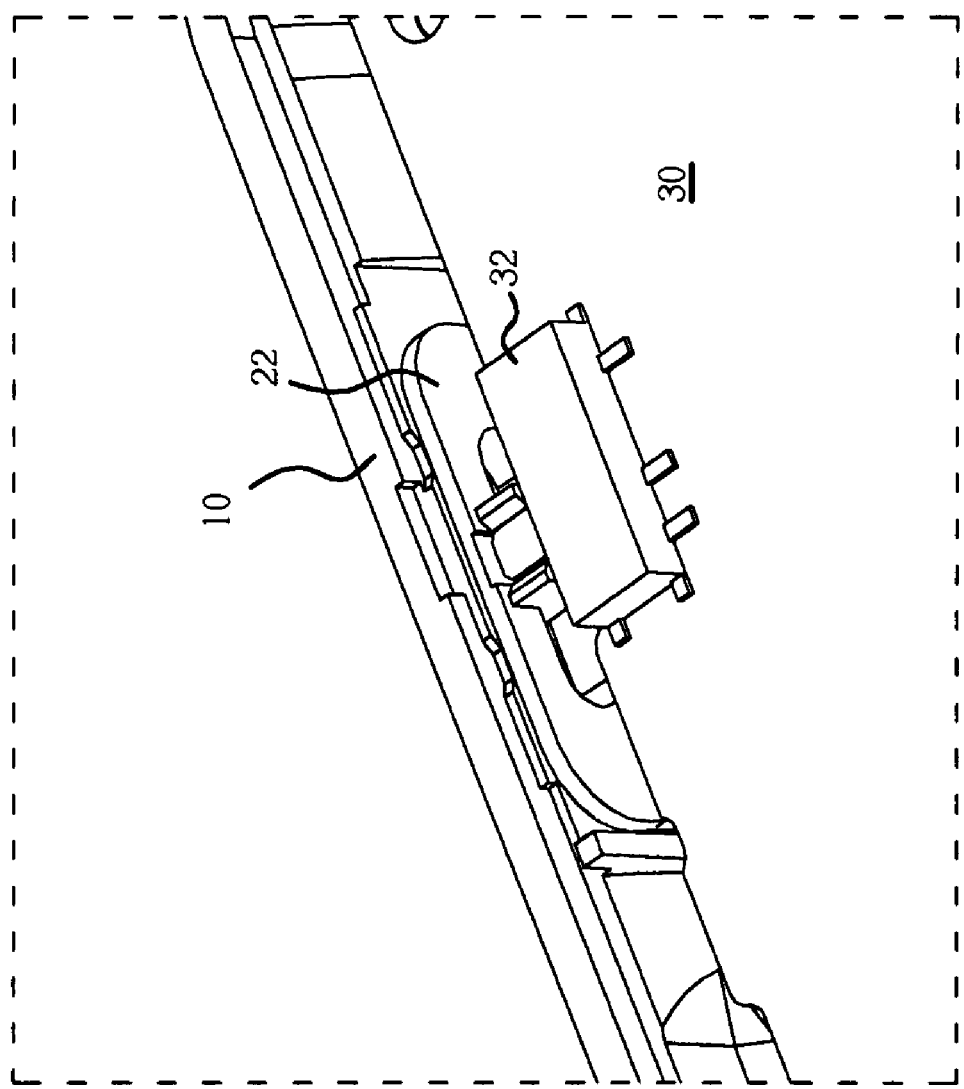

Please refer to FIG. 7, which shows a circuit board 30 to the housing 10 of FIG. 6. A latch element 32 is positioned on the circuit board 30 to engage the sliding element 20. The latch element 32 is switched to different settings by moving the sliding element 20.

Additionally, the notch 26 in FIG. 2 can be replaced by a planar surface; and therefore, an upper surface of the first stopper 16 can be a planar surface or an inclined surface to assist in assembling the sliding element 20 to the housing 10.

Figure 8:
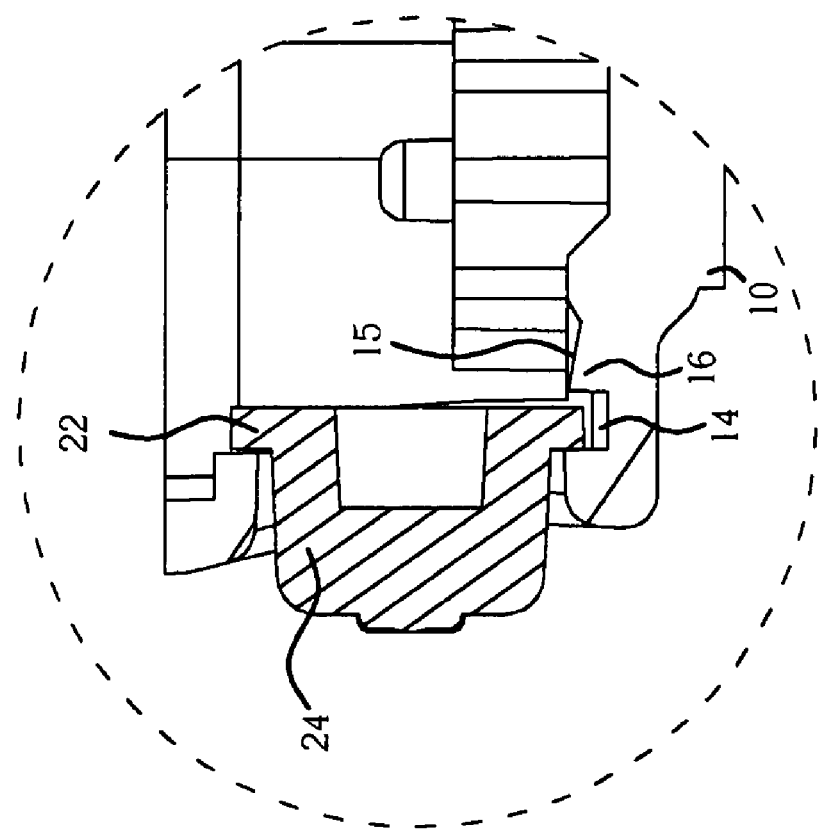
FIG. 8 is a side view of the first stopper in FIG. 1.

Please refer to FIG. 8, which is a side view of the first stopper 16 of the present invention. The upper surface of the first stopper 16 is an inclined surface 15 to assist in pushing the base 22 of the sliding element 20 on the track 14.

The present invention provides a simple assembly for the sliding element. Stoppers are positioned on the housing of the electronic device to prevent the sliding element from deviating from the track. Therefore, the present invention simplifies assembly, and subsequently the cost is reduced and so is the manufacturing time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device comprising:
    a sliding element comprising:
        a base; and
        a protrusion extended from the base; and
    a housing on which a track is formed, the track providing a space for the sliding element to slide, the housing comprising:
        a first stopper extended from a first side of the track for assisting in assembly of the sliding element and the housing and for preventing the sliding element from deviating from the track; and
        a second stopper extended from the first side of the track for preventing the sliding element from deviating from the track wherein a height of the second stopper is higher than a height of the first stopper.

2. The electronic device of claim 1 further comprising a notch formed on the base of the sliding element for assisting in assembly of the sliding element and the housing.

3. The electronic device of claim 1, wherein an upper surface of the first stopper is a planar surface or an inclined surface.

* * * * *